United States Patent [19]

Vancelette et al.

[11] Patent Number: 4,586,670
[45] Date of Patent: May 6, 1986

[54] TAPE STRIPPER FOR ELECTRICAL COMPONENT TAPE FEEDER

[75] Inventors: Stanley R. Vancelette, Manchester, N.H.; Waldo B. Hanson, Rowley; John W. Dacey, Arlington, both of Mass.

[73] Assignee: USM Corporation, Farmington, Conn.

[21] Appl. No.: 682,708

[22] Filed: Dec. 17, 1984

[51] Int. Cl.[4] .................................................. B65H 75/02
[52] U.S. Cl. ........................................ 242/55; 226/120
[58] Field of Search ............... 226/108, 115, 152, 154, 226/181, 120, 122; 29/704, 739, 741, 759, 832, 844, 740; 228/6.2; 242/55, 54, 67.3

[56] References Cited

U.S. PATENT DOCUMENTS

| | | | |
|---|---|---|---|
| 4,307,832 | 12/1981 | Taki et al. | 228/6.2 X |
| 4,437,232 | 3/1984 | Araki et al. | 29/740 |
| 4,440,355 | 4/1984 | Mori et al. | 242/55 |
| 4,458,412 | 7/1984 | Dean et al. | 29/705 |
| 4,501,064 | 2/1985 | DiNozzi et al. | 29/832 |

Primary Examiner—Donald Watkins
Attorney, Agent, or Firm—Alan N. McCartney

[57] ABSTRACT

A mechanism for stripping the tape carrying an electrical component to expose the component for removal from the tape. The cover strip is removed from the tape to expose the component and the tape is passed between guides that retain the component in the tape until removed therefrom.

4 Claims, 11 Drawing Figures

TAPE STRIPPER FOR ELECTRICAL COMPONENT TAPE FEEDER

BACKGROUND OF THE INVENTION

1. Field of the Invention

A mechanism for stripping the tape carrying an electrical component to retain the component in the tape and expose the component for removal from the tape.

2. Summary Of The Prior Art

In the assembly of micro-electronic components of a leadless type (called chips) to printed circuit boards, the components can be supplied in a carrier tape. The carrier can comprise a tape having spaced recesses each holding an electronic component. The carrier tape may also comprise upper and lower covering strips that retain the components in the recesses. The carrier tape is fed through an apparatus (tape stripper) which removes a covering strip to expose the component and the component is then removed from the recess for further processing during the component assembly to the circuit board. Examples of such tape feeders are illustrated in the U.S. Pat. Nos. 4,307,832; 4,327,482 and 4,440,355.

In processing such a carrier tape, it is necessary for the tape stripper to retain the exposed component in the tape recess until the component is removed from the tape.

SUMMARY OF THE INVENTION

In the process of mounting chip components to substrates, it is desirable to select a component from a bank of a plurality of taped component sources and deposit the preselected component onto a transfer mechanism which places the component in a conveyor for further downstream processing and ultimate placement on a printed circuit board. This general arrangement of parts of randomly selecting a predetermined component from a source and transferring the component onto a common machine conveyor for transport to a placement mechanism is illustrated in U.S. patent application Ser. No. 299,979 filed Sept. 8, 1981, now U.S. Pat. No. 4,501,064.

In processing components in this manner, it is desirable to provide an apparatus that can be combined with a plurality of apparatus of the same nature for removing components from a carrier tape and orienting the components in a conveyor for transport to further processing stations in an overall component assembly machine which mounts components on the surface of printed circuit boards. The individual apparatus are each operated in response to a programed control so that preselected components are obtained for processing in the proper sequence.

The carrier tape may comprise a carrier strip having spaced recesses containing the components. The tape will also have an upper covering strip that is stripped from the tape to expose the component for removal from the tape.

It is the object of this invention to provide a mechanism for stripping the covering from a component carrier tape to expose the component and retain the component in the tape recess until removed. The tape is pulled through a stripper which removes the upper tape cover. The tape containing the exposed component is then passed between upper and lower guides which retain the component in the tape until the component is removed from the tape for further processing.

DESCRIPTION OF THE PREFERRED EMBODIMENT

The tape stripper 34 of this invention is shown in the environment of the tape feeder 8 which forms the subject matter of the commonly owned copending U.S. patent application Ser. No. 665,453 filed Oct. 26, 1984.

Figure 1:
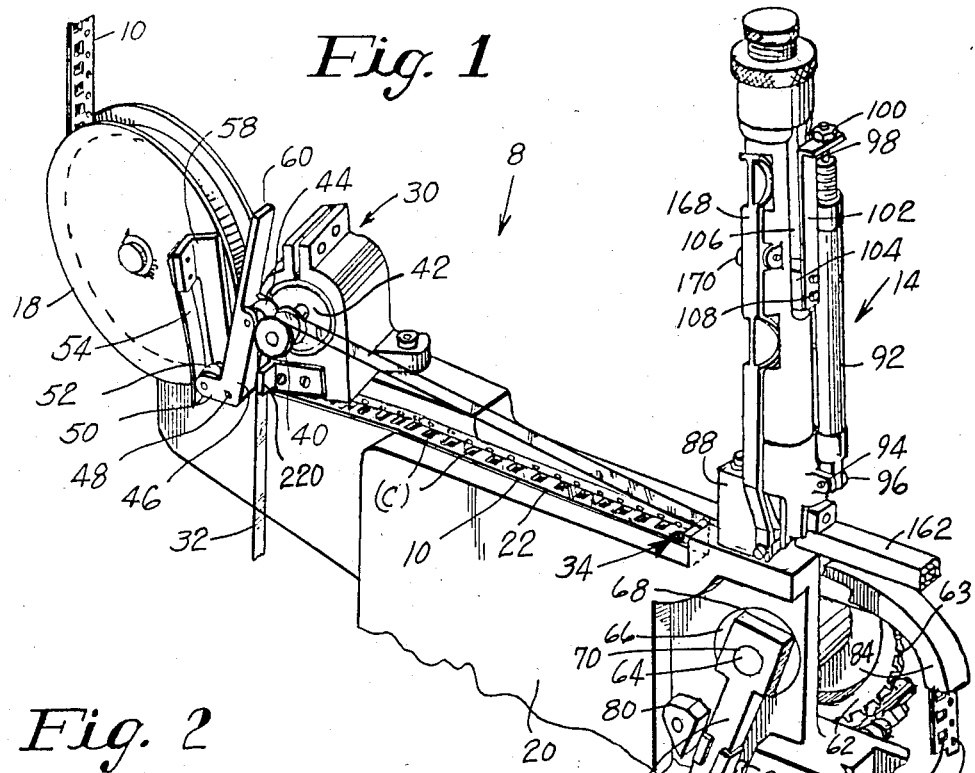
FIG. 1 is a perspective view of the tape feeder.
Figure 2:
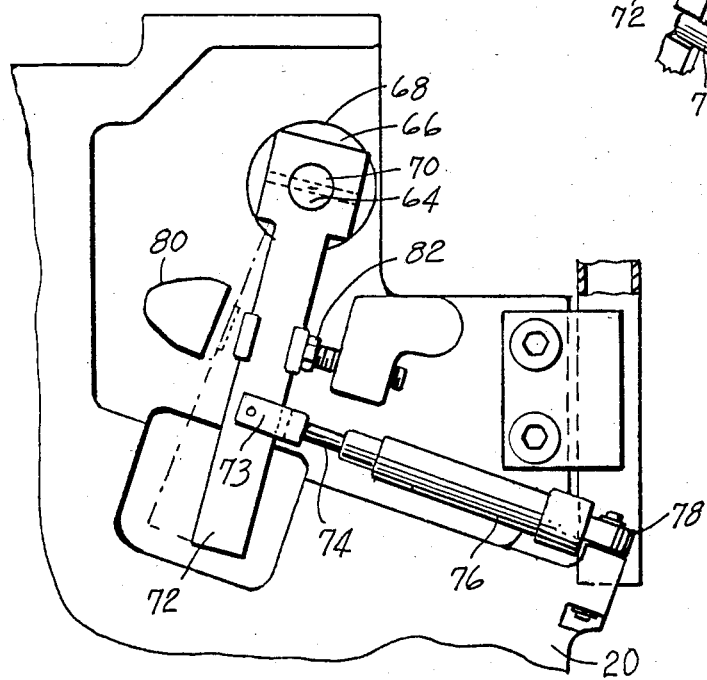
FIG. 2 is a side elevational view of the drive for the tape indexing mechanism.

Attention is now directed to FIG. 1 which illustrates the tape feeder 8 as having a component carrier tape 10 which is fed between an indexing mechanism 12 and apparatus 14 for removing the component (c) from the carrier tape 10 and placing the component in a conveyor 162 for further downstream processing. The tape feeder 8 is adapted to be positioned in a bank of feeders each of which contain reels (not shown) of taped components of similar kinds that can be preselected for processing and ultimate mounting on a printed circuit board.

The component carrier tape 10 is fed from a supply reel (not shown) around an idler feeder pulley 18 mounted on the support frame 20. The carrier tape 10 comprises a tape strip 22 having spaced recesses 24 retaining individual chip-type components (c). The carrier 10 also has spaced openings 26 which coact with the indexing mechanism 12 which draws the carrier tape 10 through the feeder 8.

Figure 5:
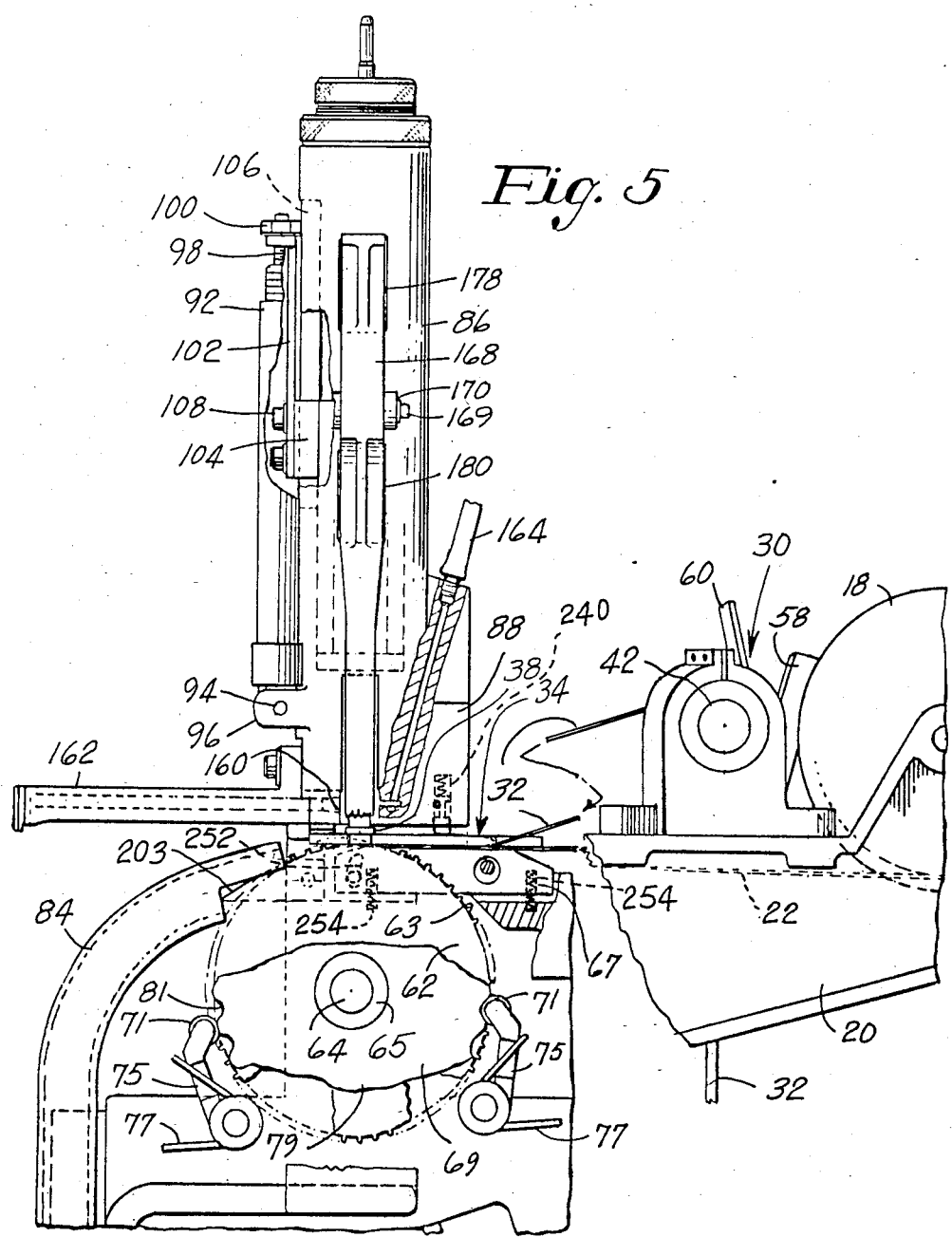
FIG. 5 is a side elevational view illustrating the carrier tape indexing mechanism and the apparatus for removing the component from the carrier, including the tape stripper apparatus.
Figure 6:
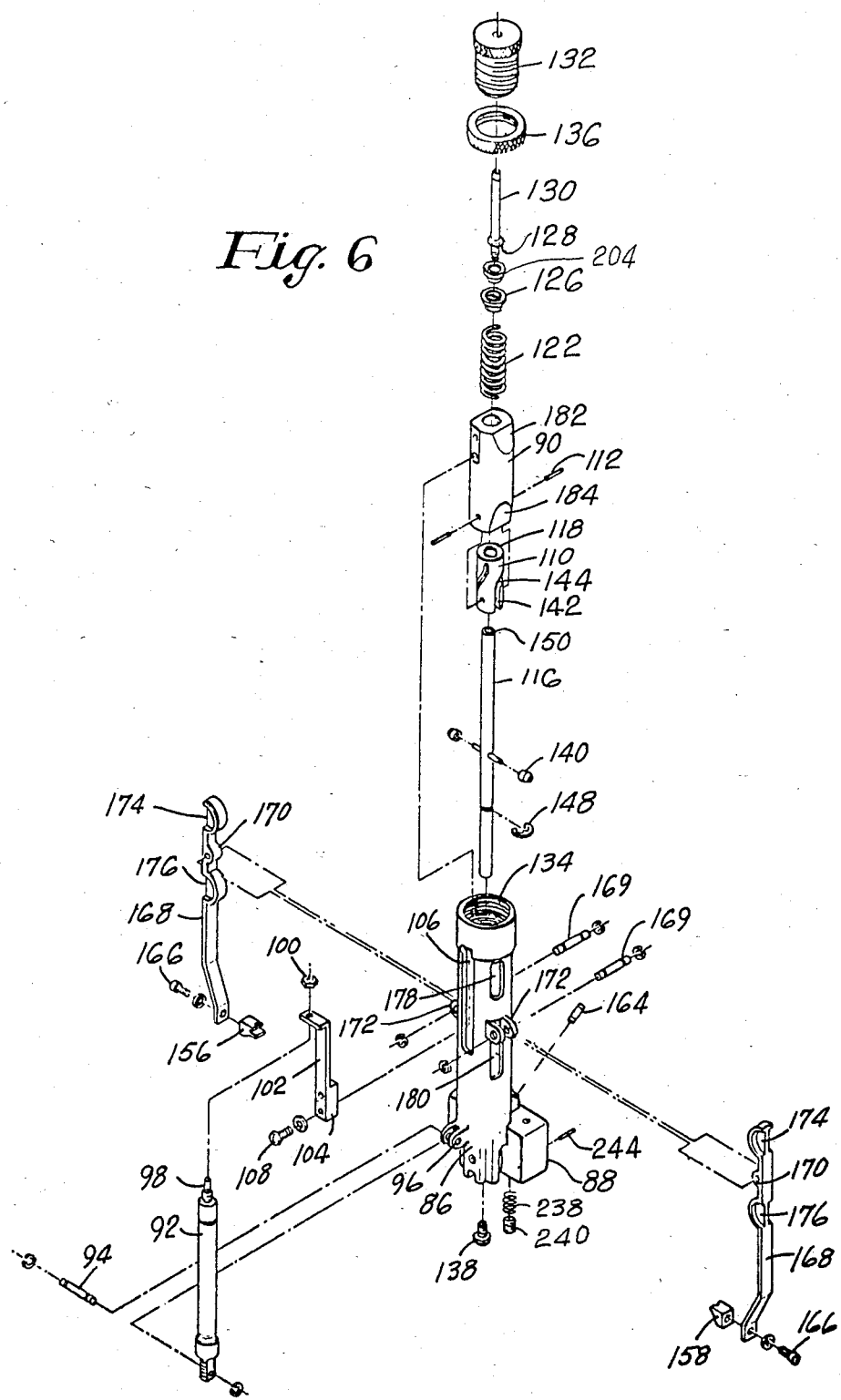
FIG. 6 is an exploded view of the apparatus for removing the component from the carrier tape.
Figure 7:
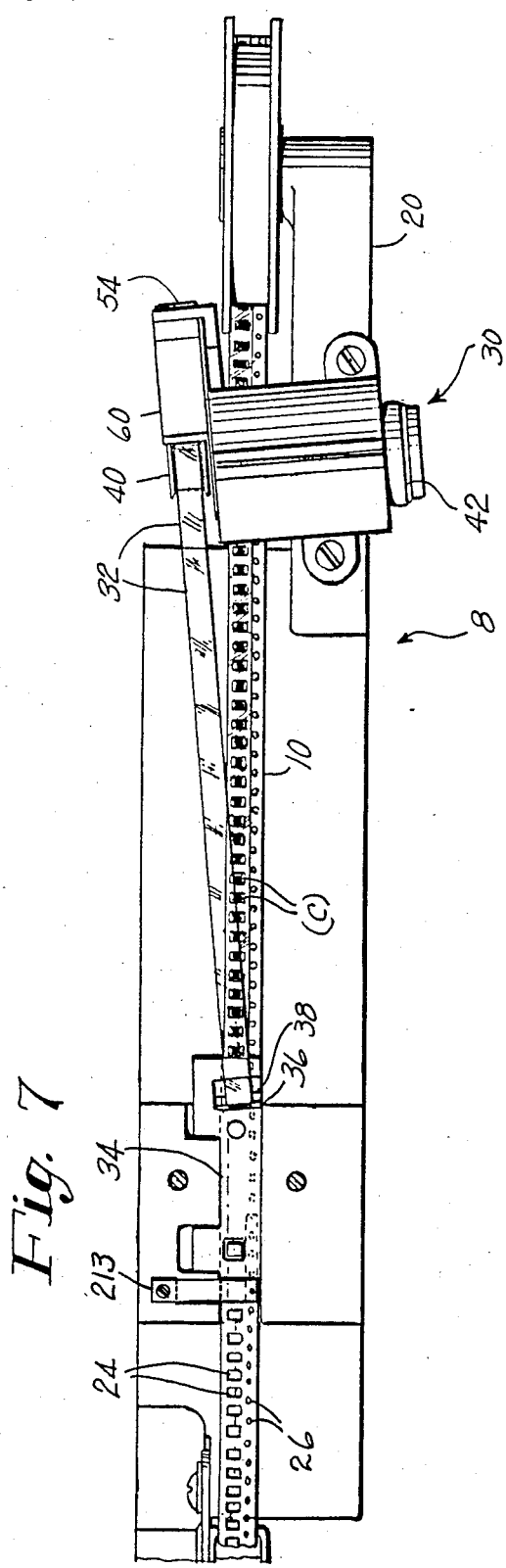
FIG. 7 is a top plan view of the tape feeder illustrating the means for removing the upper strip of the carrier tape to expose the component.

Attention is now directed to FIGS. 1, 5 and 7 which illustrate the mechanism 30 for removing the upper strip 32 of carrier tape 10 to expose the component (c) in the tape 10. A stripper 34 is retained in frame 20 and has a slanted opening 36 with a rearwardly extending beveled surface 38. The strip 32 is passed through the opening 36 and across beveled surface 38 and around pulley 40 on motor 42. The strip 32 is maintained in frictional contact with the pulley 40 by the roller 44 on the L-shaped lever 46 pivoted at 48 to the motor housing. The leg 50 of lever 46 has a roller 52 in contact with leaf spring 54 carried on bracket 58 secured to the motor housing. The bracket 58 has an extension 220. The strip 32 is passed between extension 220 and lever 46, as illustrated in FIG. 1, to guide the strip 32 out of mechanism 30. The spring 54 acting against roller 52 will force the lever 46 in a clockwise direction (FIG. 1) to force the roller 44 against the strip 32 so that the motor will pull the strip 32 rearward to remove the strip 32 from the carrier tape 10 when tape strip 22 is indexed forward. A beveled surface 35 on the lower surface of upper guide 224 (FIG. 11) is provided to keep strip 32 from being pulled under upper guide 224 if tape strip 22 is indexed forward faster than motor 42 can pull strip 32 rearward. The extension 60 on lever 46 can be grasped to pivot the lever 46 counterclockwise (FIG. 1) to cause the spring 54 to act on roller 52 holding the roller 44 spaced from pulley 40. Then, the strip 32 can be inserted between the roller 44 and the pulley 40 while separating strip 32 from the tape 22 during machine set up.

Attention is now directed to FIGS. 1 to 5, 8 and 9 which illustrate various portions of the indexing mechanism 12 which draws the tape strip 22 through the feeder. An indexing wheel 62 is mounted through a one-way clutch 65 on shaft 64 carried on frame 20. The tape strip 22 rests on a lower guide 67 which passes the strip 22 over the indexing wheel 62. The wheel 62 has a plurality of projections 63 which are adopted to extend into the openings 26 in the tape strip 22. The shaft 64 is incrementally rotated to rotate the wheel 62 to draw the strip 22 through the feeder 8. The shaft 64 is carried in bearings 66 secured within the openings 68 in the frame 20. Secured on the end 70 of shaft 64 is an arm 72 secured by bracket 73 to the rod 74 of the pneumatic drive cylinder 76 mounted to frame 20 at 78. Air supplied to cylinder 76 will extend rod 74 to pivot arm 72 and rotate the shaft 64. This will rotate the indexing wheel 62 through one-way clutch 65 to draw the strip 22 through the feeder. A stop 80 on frame 20 limits the movement of arm 72 and, thus, rotation of shaft 64. Upon the release of the cylinder 76, the arm will pivot against the stop 82 on frame 20. During this return movement of arm 72, the indexing wheel 62 remains stationary (unless acted upon by centering mechanism 69) since this is the non-drive direction of the one-way clutch 65. The stop 82 is adjustable to adjust the throw of arm 72 to locate recess 24 through the wheel projections 63 in the tape strip openings 26.

To maintain the tape recess 24 (and thus component c) in the exact desired location on each increment of indexing of the strip 22, a centering mechanism 69 comprising wheel 79 (FIG. 5) is attached to indexing wheel 62. A pair of rollers 71 are carried on arms 75 pivoted to frame 20. The springs 77 bias rollers 71 into the grooves 81 in the periphery of the wheel 79 to position and lock the wheel 79 and thus indexing wheel 62 after each indexing movement. The rollers 71 alternate between being positioned in the grooves 81 since one-half incremental rotation of wheel 79 occurs during each movement of the strip 22 from one recess 24 to the next of the strip 22.

In the operation of the above described indexing mechanism, the spent tape from which the component has been removed is guided out of the feeder 8 by passing downwardly through a chute 84 (see FIG. 1).

Attention is now directed to FIGS. 1 and 3 to 6 which illustrate the details of the apparatus 14 for removing the component (c) from the tape strip 22. A cylindrical housing 86 is part of a block 88 secured to frame 20. An outer sleeve 90 in the housing 86 is mounted to a pneumatic cylinder 92 for movement up and down in the housing 86. The cylinder 92 is secured by a pin 94 to the flanges 96 on the housing 86. The rod 98 of cylinder 92 is bolted at 100 to the bracket 102. The bracket 102 has an end portion 104 extending through the slot 106 in housing 86 and is secured to the sleeve 90 by bolts 108. Thus, air supplied to cylinder 92 will move the rod 98 upward raising the bracket 102 and moving the sleeve 90 upward in the housing 86.

An inner sleeve 110 is pinned at 112 inside the opening 114 in the outer sleeve 90. A spindle 116 passes through the opening 118 in an inner sleeve 110 and bearing surface 120 in the outer sleeve 90. A spring 122 is positioned between the surface 124 of sleeve 90 and the cap 126, which is on bearing 204, on the shoulder 128 of the end pin 130 threaded into the spindle 116. An end plug 132 is threaded into the end 134 of housing 86 and is retained by a lock nut 136. The end of the spindle 116 has a threaded nose piece 138 that is adapted to contact and pick up the component.

Figure 3:
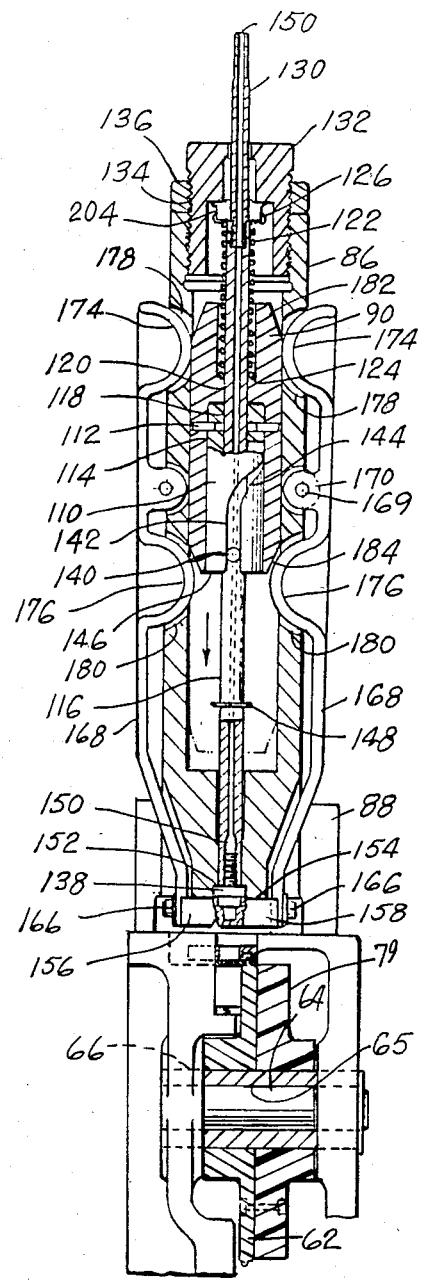
FIG. 3 is a sectional view of the apparatus for removing the components from the carrier tape showing the component retaining fingers in a closed position.
Figure 4:
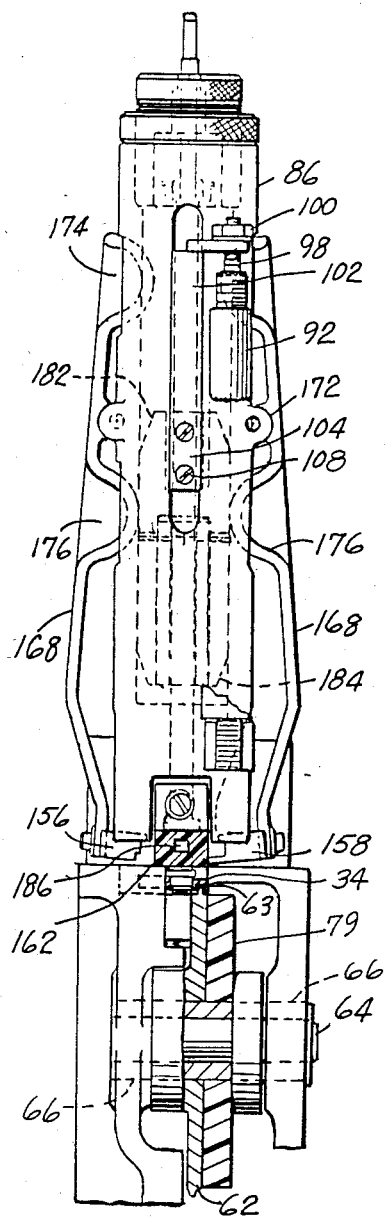
FIG. 4 is a view similar to FIG. 3 illustrating the component retaining fingers in an open position.
Figure 8:
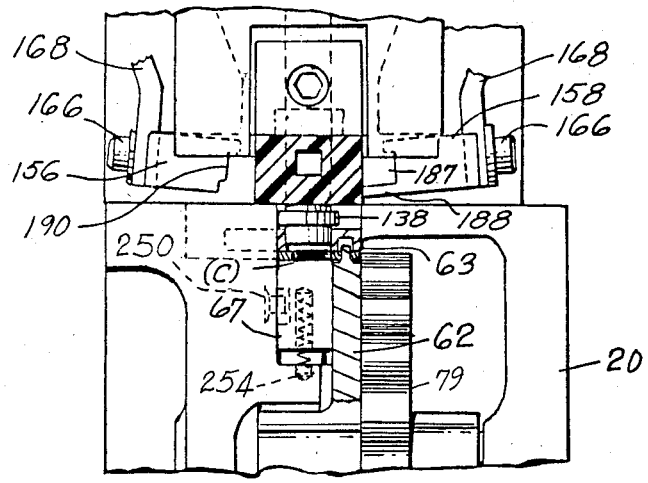
FIG. 8 is an enlarged view, partially in section, of the component removal apparatus with the retaining fingers in an open position.
Figure 9:
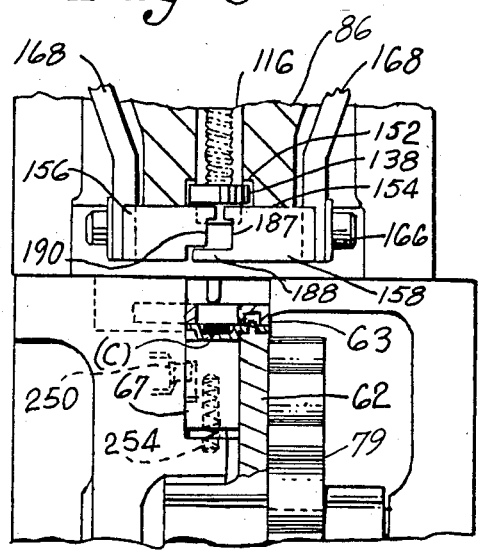
FIG. 9 is an enlarged view similar to FIG. 8 illustrating the retaining fingers in closed position.

The operation of the apparatus 14 for removing a component from the tape strip is as follows: The raise position of the rod 98 is illustrated in FIG. 3. As the rod 98 is retracted in cylinder 92, the outer sleeve 90 is lowered. At this time, the pin 140 extending from spindle 116 rides up the ramp 142 in an inner sleeve 110 and around helix 144 to rotate the spindle 90°. Upon further downward movement of the sleeve 90, the end 146 of the sleeve 90 will contact snapring 148 on spindle 116. This will lower the nose piece 138 out of housing 86 downwardly to a position above the exposed component in the tape strip 22 (FIG. 8). At this point, vacuum applied through the passage 150 in a spindle 116 will draw the component (c) from the tape strip onto the nose piece 138 on the spindle 116. As the rod 98 is extended and the sleeve 90 raised in housing 86, the spring 122 between sleeve 90 and the cap 126 will cause the spindle 116 to retract. Further, upward movement will cause bearing 204 to abut end plug 132 and stop the upward movement of the spindle 116. At this point, the nose piece 138 is positioned in the recess 152 in the end 154 of the housing 86. Further, upward movement of sleeve 90 (against the spring 122) will cause the pin 140 to ride down the helix 144 rotating the spindle 90° after the removal of the component from the tape strip. This orients the component in the proper direction for further processing downstream in the component handling machine of which the tape feeder is an operative part.

Once the component has been removed from the tape strip 22, and the spindle 116 raised to the position illustrated in FIG. 3, a pair of opposed fingers 156, 158 are in position to retain the component in line with the end 160 of the enclosed conveyor 162. A blast of air through line 164 will then send the component down the conveyor 162 for further processing.

The fingers 156, 158 are secured by bolts 166 to the ends of the opposed arms 168 each of which are pivotally attached by pins 169 at 170 to flanges 172 on the opposite sides of the housing 86. Each of the arms 168 have upper and lower cams 174, 176, respectively, that extend into the upper and lower openings 178, 180, respectively, of the housing 86. The cams 174, 176 coact with the upper and lower beveled cam ends 182, 184 of the sleeve 90 to cause the arms to pivot to open and close the fingers 156, 158 during the up and down movement of sleeve 90 in housing 86.

As the sleeve 90 is lowered in housing 86 (FIG. 3) the cam end 184 of sleeve 90 contacts lower cams 176 and pivots the arms to open the fingers 156, 158. This permits the spindle 116 to be lowered to the tape strip 22 so that a component can be placed on the nose piece 138. As the sleeve 90 is raised, the cam end 182 on sleeve 90 contacts upper cams 174 to pivot the arms (FIG. 3) to close the fingers 156, 158 against nose piece 138. At this point, the vacuum to the spindle can be released and the fingers 156, 158 will retain the component in alignment with end 160 of the opening 186 in the conveyor 162. The finger 158 has a recess 187 and shelf 188 cooperating with the surface 190 of finger 156 which will support the component at the desired location (see FIGS. 8 and 9) at the end 160 of the conveyor 162. Thereafter, a blast of air through line 164 will send the component down conveyor 162 to the next processing station of the machine.

Figures 10, 11:
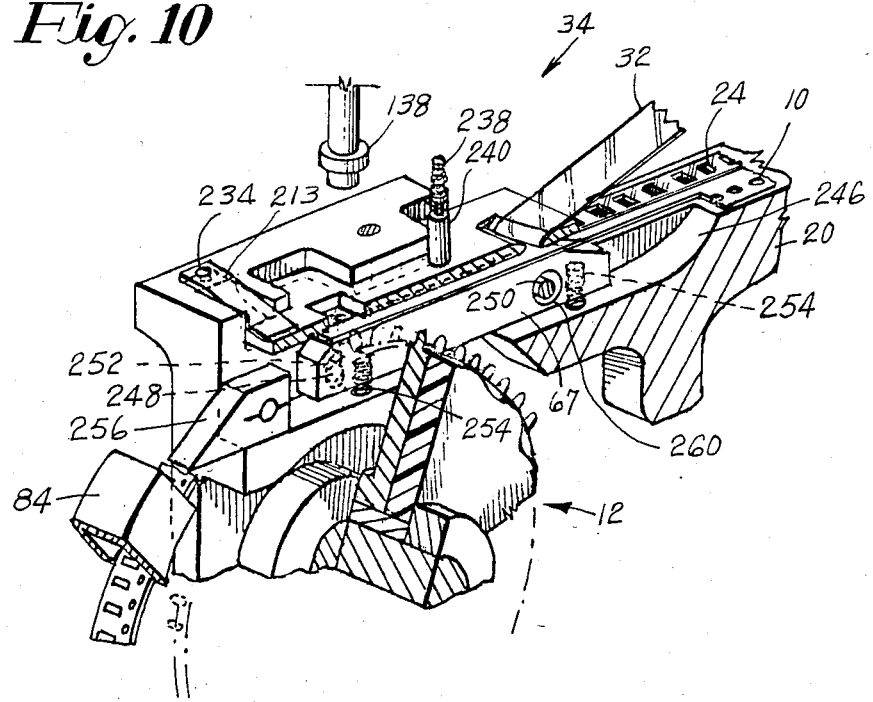
FIG. 10 is a perspective view of the tape stripper and indexing mechanism that pulls the tape through the tape feeder.
FIG. 11 is a perspective view of the upper guide of the tape stripper.

Attention is now directed to FIGS. 10 and 11 which illustrate details of the stripper 34 which removes the cover strip 32 to expose the component (c). In the operation of the stripper 34, the component (c) is exposed prior to being removed from the tape strip 22 by the apparatus 14. During this period of time, machine vibrations or other external influences may cause the component (c) to reposition in tape recess 24 or escape from the recess 24 entirely. Thus, it is necessary to retain the component (c) in the recess 24 until removed by nose piece 138 of the feeder 8.

The upper guide 224 contains the slanted opening 36 through which the strip 32 is passed, as previously described. The guide 224 has a flange 226 which sets in recess 228 in the housing 20 and locates opening 230 in relation to the index mechanism 12. Nose piece 138 is located by opening 230 in guide 224 and therefore positioned directly above component (c) permitting the removal of the component (c) from tape strip 22. A leaf spring 232 secured to housing 20 by fastener 234 biases the forward portion 236 of guide 224 downward toward the lower guide 67. A spring 238 in block 88 biases pin 240 downward against the guide 224. The pin 240 has a reduced neck area 242 receiving cross pin 244 in block 88 to retain pin 240 in block 88.

The lower guide 67 is received in slot 246 in housing 20 (see FIG. 10). The guide 67 is retained in slot 246 by front and rear pins 248, 250. The front pin 248 is positioned in slot 252 in guide 67 and rear pin 250 is positioned in hole 260 in guide 67. Springs 254 are positioned under the front and rear of guide 67 to bias guide 67 upwardly (the upward force by springs 254 is less than the downwarded force on upper guide 224 exerted by pin 240 and leaf spring 232).

It can thus be seen that after the strip 32 is removed by stripper 34, the tape strip 22 with the exposed component is passed between the upper and lower guides that retain the component in the tape strip 22 until removed by nose piece 138. The blank tape is then passed over guide 256 which strips the blank tape off indexing wheel 62 and down chute 84 away from the tape feeder.

It should also be noted that with the strip 22 retained between biased upper and lower guides, tapes of different thicknesses can be accommodated. Further, some tapes may have an embossed area holding the component and the biased guides can also accommodate tapes of this type while still retaining the component in the tape recess.

We claim:

1. A stripping mechanism for removing the upper strip of an electrical component carrier tape to expose the component in the tape comprising:
  a. a housing for supporting and positioning the stripping mechanism;
  b. apparatus for removing the upper strip of the carrier tape;
  c. upper and lower guide means positioned on said housing adapted to receive the stripped carrier tape there between with the component exposed for removal from the tape,
  d. said upper and lower guide means coacting to retain the stripped tape until removed; and,
  e. means biasing said lower guide means upwardly and means biasing said upper guide means downwardly to retain the stripped tape and component therein therebetween.

2. The stripping mechanism of claim 1 wherein said apparatus for removing forms part of said upper guide means.

3. The stripping mechanism of claim 1 including means to guide the carrier tape away from the stripping mechanism after the removal of the component from the tape.

4. The stripping mechanism of claim 1 wherein the said upper guide means includes means to precisely position the component removal means.

* * * * *